US012777631B2

(12) United States Patent
Kim et al.

(10) Patent No.: US 12,777,631 B2
(45) Date of Patent: Oct. 27, 2026

(54) SEMICONDUCTOR DEVICE AND METHOD FOR FABRICATING THE SAME

(71) Applicant: SK hynix Inc., Gyeonggi-do (KR)

(72) Inventors: Gil Seop Kim, Gyeonggi-do (KR); Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 432 days.

(21) Appl. No.: 18/460,601

(22) Filed: Sep. 4, 2023

(65) Prior Publication Data

US 2024/0341080 A1 Oct. 10, 2024

(30) Foreign Application Priority Data

Apr. 7, 2023 (KR) ........................ 10-2023-0045897

(51) Int. Cl.
*H10B 12/00* (2023.01)

(52) U.S. Cl.
CPC ............. *H10B 12/30* (2023.02); *H10B 12/03* (2023.02); *H10B 12/05* (2023.02)

(58) Field of Classification Search
CPC ........ H10B 12/30; H10B 12/03; H10B 12/05; H10B 41/20; H10B 41/30; H10B 41/40; H10B 43/20; H10B 43/30; H10B 43/40; H10D 1/714; H10D 1/711
See application file for complete search history.

(56) References Cited

U.S. PATENT DOCUMENTS

| | | | | |
|---|---|---|---|---|
| 11,282,548 | B1 | 3/2022 | Lee et al. | |
| 11,515,318 | B2 * | 11/2022 | Lilak | H10D 64/035 |
| 11,871,556 | B2 * | 1/2024 | Kim | H10B 12/30 |
| 2012/0261747 | A1 * | 10/2012 | Park | H10B 61/22 257/330 |
| 2019/0043882 | A1 * | 2/2019 | Hasnat | H10B 43/27 |
| 2020/0279601 | A1 * | 9/2020 | Kim | G11C 11/4097 |
| 2021/0257366 | A1 * | 8/2021 | Lee | H10B 12/50 |
| 2021/0257368 | A1 * | 8/2021 | Jung | H10B 12/20 |
| 2022/0005809 | A1 * | 1/2022 | Kim | H10D 62/121 |
| 2022/0013524 | A1 * | 1/2022 | Ryu | H10D 86/80 |
| 2022/0157819 | A1 * | 5/2022 | Jung | H10B 12/30 |
| 2022/0208766 | A1 * | 6/2022 | Kim | H10B 12/30 |
| 2022/0246619 | A1 * | 8/2022 | Kim | H10B 12/50 |
| 2022/0399341 | A1 * | 12/2022 | Kim | H10B 12/485 |
| 2023/0060149 | A1 * | 3/2023 | Zhu | H10B 12/05 |
| 2023/0064388 | A1 * | 3/2023 | Liu | H10N 70/841 |
| 2024/0215227 | A1 * | 6/2024 | Oh | H10B 12/315 |
| 2024/0224500 | A1 * | 7/2024 | Yoon | H10B 12/482 |
| 2024/0224511 | A1 * | 7/2024 | Kim | H10B 12/03 |

(Continued)

*Primary Examiner* — Jarrett J Stark
(74) *Attorney, Agent, or Firm* — IP&T GROUP LLP

(57) ABSTRACT

A semiconductor device includes: a lower structure; a first cell isolation layer and a second cell isolation layer stacked in a direction perpendicular to the lower structure and each including a void; a horizontal layer disposed between the first cell isolation layer and the second cell isolation layer; a first horizontal conductive line disposed between the first cell isolation layer and the horizontal layer, and a second horizontal conductive line disposed between the second cell isolation layer and the horizontal layer; a vertical conductive line coupled to a first side of the horizontal layer; and a data storage element including a first electrode coupled to a second side of the horizontal layer, and disposed between the first cell isolation layer and the second cell isolation layer.

13 Claims, 15 Drawing Sheets

(56) References Cited

U.S. PATENT DOCUMENTS

| | | | | |
|---|---|---|---|---|
| 2024/0341080 | A1* | 10/2024 | Kim | H10D 1/714 |
| 2025/0008724 | A1* | 1/2025 | Kim | H10B 12/03 |
| 2025/0081442 | A1* | 3/2025 | Kim | H10B 12/482 |
| 2025/0280529 | A1* | 9/2025 | Liu | H01L 23/5283 |
| 2025/0338478 | A1* | 10/2025 | Zheng | H10B 12/315 |

* cited by examiner

SEMICONDUCTOR DEVICE AND METHOD FOR FABRICATING THE SAME

CROSS-REFERENCE TO RELATED APPLICATIONS

The present application claims priority of Korean Patent Application No. 10-2023-0045897, filed on Apr. 7, 2023, which is incorporated herein by reference in its entirety.

BACKGROUND

1. Field

Embodiments of the present invention relate to a semiconductor device, and more particularly, to a semiconductor device including three-dimensional memory cells, and a method for fabricating the semiconductor device.

2. Description of the Related Art

To satisfy recent demands for large capacity and miniaturization of memory devices, three-dimensional (3-D) memory devices including memory cells that are stacked in three dimensions have been suggested. However, significant efforts are currently expended in order to improve the reliance, and performance characteristics of 3-D memory devices.

SUMMARY

Embodiments of the present invention are directed to an improved 3-D semiconductor device including highly integrated memory cells, and a method for fabricating the same. The 3-d semiconductor device may provide enhanced capacity and performance characteristics. The 3D-semiconductor device is referred to also, for simplicity, as the semiconductor device.

In accordance with an embodiment of the present invention, a semiconductor device includes: a lower structure; a first cell isolation layer and a second cell isolation layer stacked in a direction perpendicular to the lower structure and each including a void; a horizontal layer disposed between the first cell isolation layer and the second cell isolation layer; a first horizontal conductive line disposed between the first cell isolation layer and the horizontal layer, and a second horizontal conductive line disposed between the second cell isolation layer and the horizontal layer; a vertical conductive line coupled to a first side of the horizontal layer; and a data storage element including a first electrode coupled to a second side of the horizontal layer, and disposed between the first cell isolation layer and the second cell isolation layer.

In accordance with another embodiment of the present invention, a method for fabricating a semiconductor device includes: forming a cell body including a first cell isolation layer, a first sacrificial dielectric layer, a horizontal layer, a second sacrificial dielectric layer, and a second cell isolation layer over a lower structure; horizontally recessing the first sacrificial dielectric layer, the horizontal layer, and the second sacrificial dielectric layer, individually, to form a storage opening in the cell body; forming a first electrode layer over the storage opening and the cell body; forming a first passivation layer and a second passivation layer over the first electrode layer to fill the storage opening; cutting the first electrode layer by using the first and second passivation layers as barriers to form a first electrode disposed in the storage opening; horizontally recessing the first and second cell isolation layers by using the second passivation layer as a barrier to expose a portion of an outer wall of the first electrode; removing the first and second passivation layers to expose an inner wall of the first electrode; and sequentially forming a dielectric layer and a second electrode on the inner and outer walls of the first electrode. Each of the first and second cell isolation layers includes a void. The voids vertically overlap with the first electrode. The first and second passivation layers include a material having an etch selectivity with respect to the first electrode layer. The first passivation layer includes silicon oxide, and the second passivation layer includes polysilicon. The method further includes before the forming of the storage opening in the cell body, replacing portions of the first sacrificial dielectric layer and the second sacrificial dielectric layer with horizontal conductive lines, respectively; and forming a vertical conductive line passing through the cell body to be coupled to a first side of the horizontal layer. The horizontal layer includes a semiconductor material. The first electrode, the dielectric layer and the second electrode form a capacitor. Each of the first and second cell isolation layers includes a void, the method further including: before the removing of the first and second passivation layers, performing a first etching process on the first and second cell isolation layers to expose the voids of the first and second cell isolation layers; performing a deposition process of a void capping material to cover the exposed voids; and performing a second etching process including etching the void capping material and etching the first and second cell isolation layers to form a void capping layer capping the voids while exposing the outer wall of the first electrode. The first and second cell isolation layers, the void capping material, and the first passivation layer include silicon oxide, and the second passivation layer includes polysilicon. The voids do not overlap with the outer wall of the first electrode.

These and other features and advantages of the semiconductor device and the method will become better understood from the following drawings and detailed description of various embodiments.

DETAILED DESCRIPTION

Figure 1:
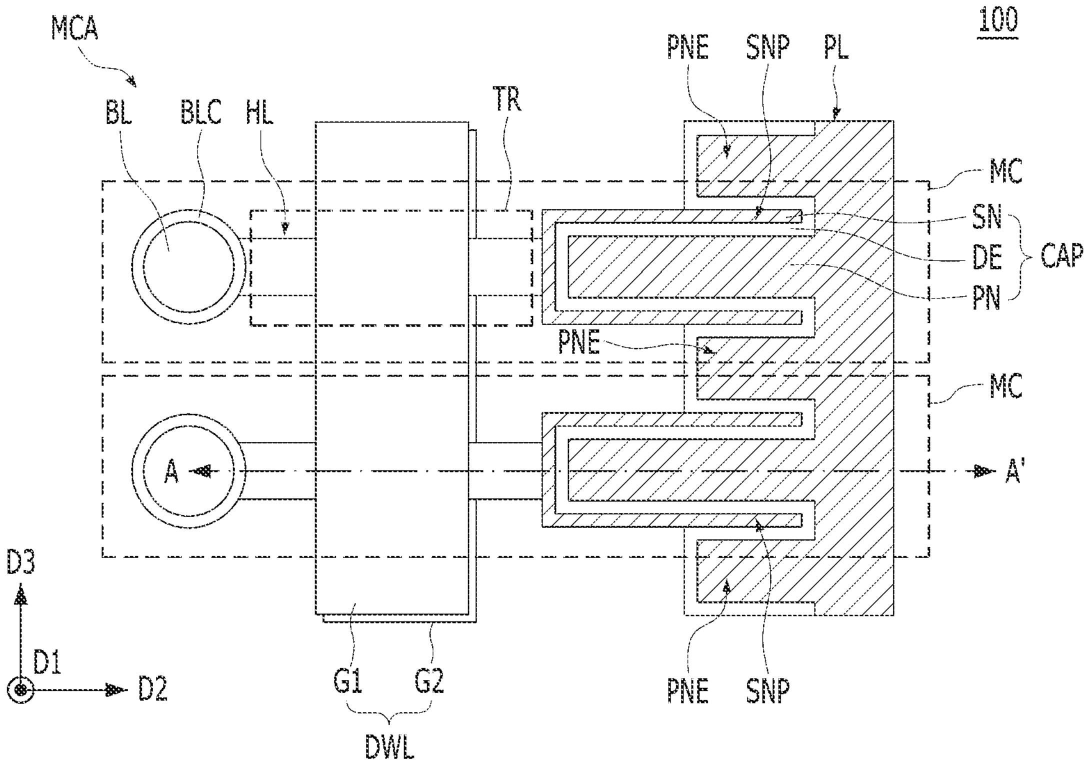
FIG. 1 is a schematic plan view illustrating a semiconductor device in accordance with an embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to an embodiment of the present invention described below, memory cells may be vertically stacked to increase memory cell density and reduce parasitic capacitance.

Figure 2:
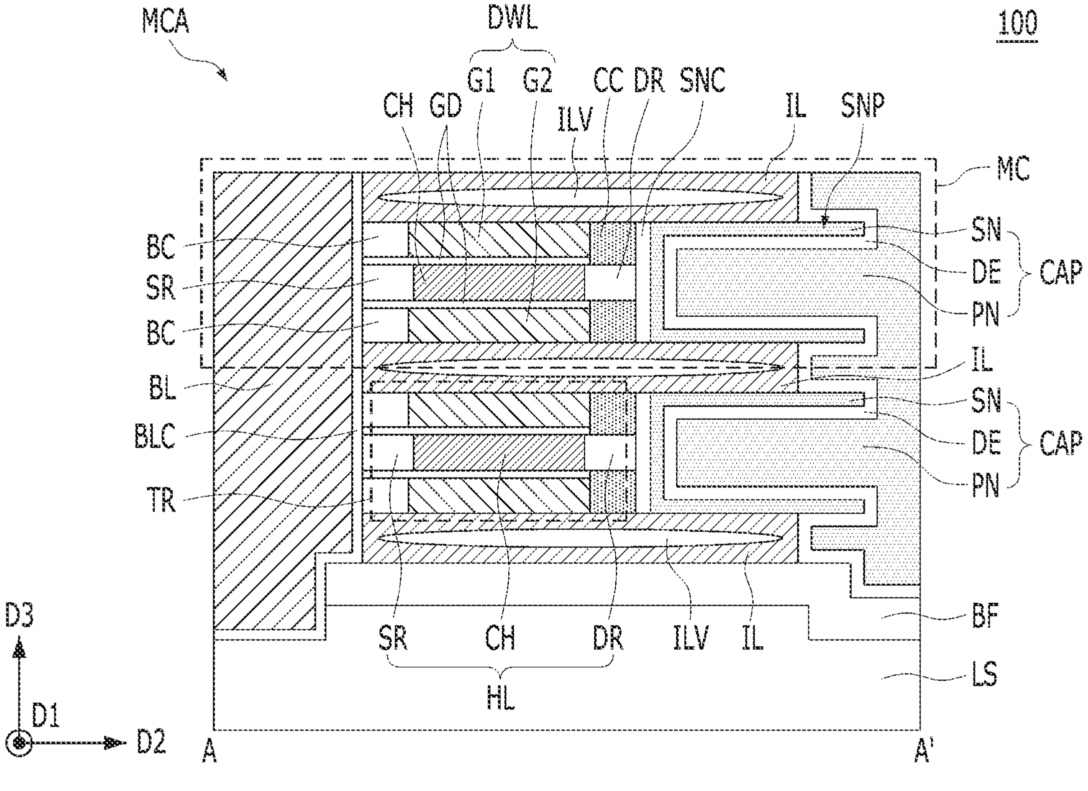
FIG. 2 is a schematic cross-sectional view taken along a line A-A' shown in FIG. 1.

FIG. 1 is a schematic plan view illustrating a semiconductor device 100 in accordance with an embodiment of the present invention. FIG. 2 is a schematic cross-sectional view taken along a line A-A' shown in FIG. 1.

Referring to FIGS. 1 and 2, the semiconductor device 100 may include a memory cell array MCA. The memory cell array MCA may include a plurality of memory cells MC. The memory cell array MCA may include a 3D array of memory cells MC. The 3D array of memory cells MC may include a column array of memory cells MC and a row array of memory cells MC. The column array of memory cells MC may include a plurality of memory cells MC that are stacked in a first direction D1, and the row array of memory cells MC may include a plurality of memory cells MC that are horizontally disposed in a second direction D2 and a third direction D3.

Cell isolation layers IL may be disposed between memory cells MC stacked in the first direction D1. The cell isolation layers IL may be made of any suitable dielectric material, including for example, silicon oxide. The cell isolation layers IL may include voids ILV. The voids ILV may also be referred to as air gaps. The voids ILV may not come into contact with any of the surrounding structures.

The memory cell array MCA may be disposed on or over a lower structure LS.

Each memory cell MC may include a vertical conductive line BL, a switching element TR, and a data storage element CAP. The switching element TR may include a horizontal layer HL, a gate dielectric layer GD, and a horizontal conductive line DWL. The data storage element CAP may be, for example, a memory element, such as a capacitor. The vertical conductive line BL may be, for example, a bit line. The horizontal conductive line DWL may be, for example, a word line, and the horizontal layer HL may be, for example, an active layer. The data storage element CAP may include first and second electrodes SN, and PN separated by a dielectric layer DE. The switching element TR may be, for example, a transistor, and the horizontal conductive line DWL may serve as a gate electrode for the transistor. The switching element TR may also be referred to herein as an access element or a select element.

The memory cell array MCA may include a plurality of horizontal conductive lines DWL vertically stacked in the first direction D1. The memory cell array MCA may include a plurality of horizontal layers HL vertically stacked in the first direction D1. The memory cell array MCA may include a plurality of data storage elements CAP vertically stacked in the first direction D1.

A buffer layer BF may be disposed between the lowermost horizontal conductive line DWL among the horizontal conductive lines DWL and the lower structure LS. The buffer layer BF may include a dielectric material. The buffer layer BF may include silicon oxide.

The buffer layer BF may electrically separate the vertical conductive line BL and the data storage elements CAP from the lower structure LS. For example, the buffer layer BF may cover the entire surface of the lower structure LS, and thus the vertical conductive line BL and the data storage elements CAP may be electrically separated from the lower structure LS.

The vertical conductive line BL may extend vertically from the top of the lower structure LS in the first direction D1. The horizontal layer HL may extend in the second direction D2 crossing the first direction D1. The horizontal conductive line DWL may extend in the third direction D3 crossing the first and second directions D1 and D2.

The vertical conductive line BL may be vertically oriented in the first direction D1. The vertical conductive line BL may be referred to as a first conductive line, a vertically oriented bit line, vertically extended bit line, or a pillar-shape bit line. The vertical conductive line BL may include a conductive material. The vertical conductive line BL may include a silicon-based material, a metal-based material, or a combination thereof. The vertical conductive line BL may include polysilicon, a metal, a metal nitride, a metal silicide, or a combination thereof. The vertical conductive line BL may include polysilicon, titanium nitride, tungsten, or a combination thereof. For example, the vertical conductive line BL may include polysilicon or titanium nitride (TIN) which is doped with an N-type impurity. The vertical conductive line BL may include a TiN/W stack which includes titanium nitride and tungsten.

The switching element TR may include a transistor, and thus, the horizontal conductive line DWL may be referred to as a second conductive line, a horizontal gate line or a horizontal word line.

The horizontal conductive line DWL may extend in the third direction D3, and the horizontal layer HL may extend in the second direction D2. The horizontal conductive line DWL and the horizontal layer HL may cross each other. The horizontal layer HL may be horizontally arranged from the vertical conductive line BL. The horizontal conductive line DWL may have a double structure. For example, the horizontal conductive line DWL may include first and second horizontal conductive lines G1 and G2 that are facing each other with the horizontal layer HL interposed therebetween. A gate dielectric layer GD may be formed on the upper and lower surfaces of the horizontal layer HL. A first horizontal conductive line G1 may be disposed on or over the horizontal layer HL, and a second horizontal conductive line G2 may be disposed below the horizontal layer HL. The horizontal conductive line DWL may include a pair of a first horizontal conductive line G1 and a second horizontal conductive line G2. In the horizontal conductive line DWL, the first horizontal conductive line G1 and the second horizontal conductive line G2 may have the same potential as each other. For example, the first horizontal conductive line G1 and the second horizontal conductive line G2 may form a pair and be included in one memory cell MC. The same driving voltage may be applied to the first horizontal conductive line G1 and the second horizontal conductive line G2.

The horizontal layer HL may extend in the second direction D2. The horizontal layer HL may include a semiconductor material. For example, the horizontal layer HL may include polysilicon, monocrystalline silicon, germanium, or silicon germanium. According to another embodiment of the present invention, the horizontal layer HL may include an oxide semiconductor material. For example, the oxide semiconductor material may include indium gallium zinc oxide (IGZO).

The upper and lower surfaces of the horizontal layer HL may have flat surfaces. In other words, the upper and lower surfaces of the horizontal layer HL may be parallel to each other in the second direction D2.

The horizontal layer HL may include a channel CH, a first doped region SR between the channel CH and the vertical conductive line BL, and a second doped region DR between the channel CH and the data storage element CAP. When the horizontal layer HL is formed of an oxide semiconductor material, the channel CH may be formed of an oxide semiconductor material, and the first and second doped regions SR and DR may be omitted. The horizontal layer HL may also be referred to as an active layer or a thin-body layer.

The first doped region SR and the second doped region DR may be doped with impurities of the same conductivity type. The first doped region SR and the second doped region DR may be doped with an N-type impurity or a P-type impurity. The first doped region SR and the second doped region DR may include at least one impurity selected among arsenic (As), phosphorus (P), boron (B), indium (In), and combinations thereof. The first doped region SR may be coupled to the vertical conductive line BL, and the second doped region DR may be coupled to the first electrode SN of the data storage element CAP. The first doped region SR and the second doped region DR may be referred to as a first source/drain region and a second source/drain region.

The gate dielectric layer GD may include silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or a combination thereof.

The gate dielectric layer GD may have a shape that partially covers a first surface (or upper surface) and a second surface (or lower surface) of the horizontal layer HL. The length of the gate dielectric layer GD in the second direction D2 may be smaller than that of the horizontal layer HL. The first and second surfaces of the horizontal layer HL may be flat surfaces.

The horizontal conductive line DWL may include a metal-based material, a semiconductor material, or a combination thereof. The horizontal conductive line DWL may include titanium nitride, tungsten, polysilicon, or a combination thereof. For example, the horizontal conductive line DWL may include a TiN/W stack in which titanium nitride and tungsten are sequentially stacked. The horizontal conductive line DWL may include an N-type work function material or a P-type work function material. The N-type work function material may have a low work function of approximately 4.5 eV or less, and the P-type work function material may have a high work function of approximately 4.5 eV or more.

The data storage element CAP may be horizontally disposed in the second direction D2 from the switching element TR. The data storage element CAP may include a first electrode SN extending horizontally from the horizontal layer HL in the second direction D2. The data storage element CAP may further include a second electrode PN over the first electrode SN, and a dielectric layer DE between the first electrode SN and the second electrode PN. The first electrode SN, the dielectric layer DE, and the second electrode PN may be horizontally arranged in the second direction D2. The first electrode SN may have a horizontally oriented cylinder-shape. The dielectric layer DE may conformally cover the inner wall and part of the outer wall of the cylinder of the first electrode SN. The second electrode PN may cover a cylinder inner wall and a part of a cylinder outer wall of the first electrode SN over the dielectric layer DE. The first electrode SN may be electrically connected to the second doped region DR. The second electrode PN may include a plurality of outer nodes PNE disposed on an outer wall of the first electrode SN.

The first electrode SN may have a three-dimensional structure, and the first electrode SN of the three-dimensional structure may have a horizontal three-dimensional structure oriented in the second direction D2. As an example of a 3D structure, the first electrode SN may have a cylinder shape. According to another embodiment of the present invention, the first electrode SN may have a pillar shape or a pylinder shape. The pylinder shape may refer to a structure in which a pillar shape and a cylinder shape are merged. The first electrode SN may include protruding portions SNP, and the protruding portions SNP of the first electrode SN may be partially covered by the second electrode PN and outer nodes PNE.

The first electrode SN and the second electrode PN may include a metal, a noble metal, a metal nitride, a conductive metal oxide, a conductive noble metal oxide, a metal carbide, a metal silicide, or a combination thereof. For example, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack. The second electrode PN may include a combination of a metal-based material and a silicon-based material. For example, the second electrode PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the first electrode SN, and titanium nitride (TIN) may serve as the second electrode PN of the data storage element CAP, and tungsten nitride may be a low-resistance material.

The dielectric layer DE may be referred to as a capacitor dielectric layer or a memory layer. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). The dielectric layer DE may be formed of a single layer or a multi-layer including two or more layers of the aforementioned high-k materials. The dielectric layer DE may be formed of a composite layer of the aforementioned high-k materials.

The dielectric layer DE may be formed of zirconium (Zr)-based oxide. The dielectric layer DE may have a stack structure including zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap energy than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure including zirconium oxide, hafnium oxide, and aluminum oxide, a laminated structure including zirconium oxide, hafnium oxide, and aluminum oxide, or a mixed structure including zirconium oxide, hafnium oxide, and aluminum oxide.

According to another embodiment of the present invention, an interface control layer for improving leakage current may be further formed between the first electrode SN and the dielectric layer DE. The interface control layer may include titanium oxide ($TiO_2$), tantalum oxide ($Ta_2O_5$), or niobium oxide ($Nb_2O_5$). The interface control layer may also be formed between the second electrode PN and the dielectric layer DE.

The data storage element CAP may include a metal-insulator-metal (MIM) capacitor. The first electrode SN and the second electrode PN may include a metal-based material.

The data storage element CAP may be replaced with another data storage material. For example, the data storage material may be a phase change material, a magnetic tunnel junction (MTJ), or a variable resistance material.

The first capping layer BC may be disposed between the horizontal conductive line DWL and the vertical conductive line BL. A second capping layer CC may be disposed between the horizontal conductive line DWL and the first electrode SN of the data storage element. The first capping layer BC may be disposed between the first horizontal conductive line G1 and the vertical conductive line BL, and the first capping layer BC may be disposed between the second horizontal conductive line G2 and the vertical conductive lines BL. The second capping layer CC may be disposed between the first horizontal conductive line G1 and the first electrode SN of the data storage element CAP, and the second capping layer CC may be disposed between the second horizontal conductive line G2 and the first electrode SN of the data storage element CAP.

The first and second capping layers BC and CC may include a dielectric material. The first and second capping layers BC and CC may include silicon oxide, silicon nitride, silicon carbon oxide, an air gap, or a combination thereof. The first capping layer BC may include silicon oxide, and the second capping layer CC may include a stack of silicon oxide and silicon nitride.

The memory cell MC may include a first contact node BLC between the vertical conductive line BL and the horizontal layer HL, and a second contact node SNC between the horizontal layer HL and the data storage element CAP. The first and second contact nodes BLC and SNC may include doped polysilicon. The first doped region SR and the second doped region DR may include impurities diffused from the first and second contact nodes BLC and SNC, respectively. The first contact node BLC may surround the outer wall of the vertical conductive line BL.

The second electrodes PN of the data storage elements CAP may be coupled to a common plate PL. In an embodiment, the second electrodes PN of the data storage elements CAP and the common plate PL may be made of the same material and form an integral continuous structure. The horizontal layers HL of the switching elements TR disposed horizontally in the third direction D3 may share one horizontal conductive line DWL. The horizontal layers HL of the switching elements TR disposed horizontally in the third direction D3 may be coupled to different vertical conductive lines BL. The switching elements TR stacked in the first direction D1 may share one vertical conductive line BL. The switching elements TR disposed horizontally in the third direction D3 may share one horizontal conductive line DWL.

The lower structure LS may include a semiconductor substrate. The lower structure LS may include a peripheral circuit portion. The peripheral circuit portion of the lower structure LS may be disposed at a lower level than the memory cell array MCA. This may be referred to as a COP (Cell-Over-Peripheral) structure. The peripheral circuit portion may include at least one control circuit for driving the memory cell array MCA. The at least one control circuit of the peripheral circuit portion may include an N-channel transistor, a P-channel transistor, a CMOS circuit, or a combination thereof. The at least one control circuit of the peripheral circuit portion may include an address decoder circuit, a read circuit, a write circuit, and the like. The at least one control circuit of the peripheral circuit portion may include a planar channel transistor, a recess channel transistor, a buried gate transistor, a fin channel transistor (FinFET), etc.

For example, the peripheral circuit portion may include sub-word line drivers and a sense amplifier. The horizontal conductive lines DWL may be coupled to the sub-word line drivers. The vertical conductive line BL may be coupled to the sense amplifier.

According to another embodiment of the present invention, the peripheral circuit portion may be disposed at a higher level than the memory cell array MCA. This may be referred to as a POC (Peripheral-Over-Cell) structure.

The memory cell array MCA may include horizontal conductive lines DWL that are stacked in the first direction D1. The individual horizontal conductive lines DWL may include a pair of a first horizontal conductive line G1 and a second horizontal conductive line G2.

According to another embodiment of the present invention, the semiconductor device 100 may include a mirror-type structure sharing a common plate PL.

The memory cell array MCA illustrates a three-dimensional memory cell array including four memory cells MC as an example.

FIGS. 3 to 24 illustrate an example of a method for fabricating a semiconductor device in accordance with an embodiment of the present invention.

Figure 3:
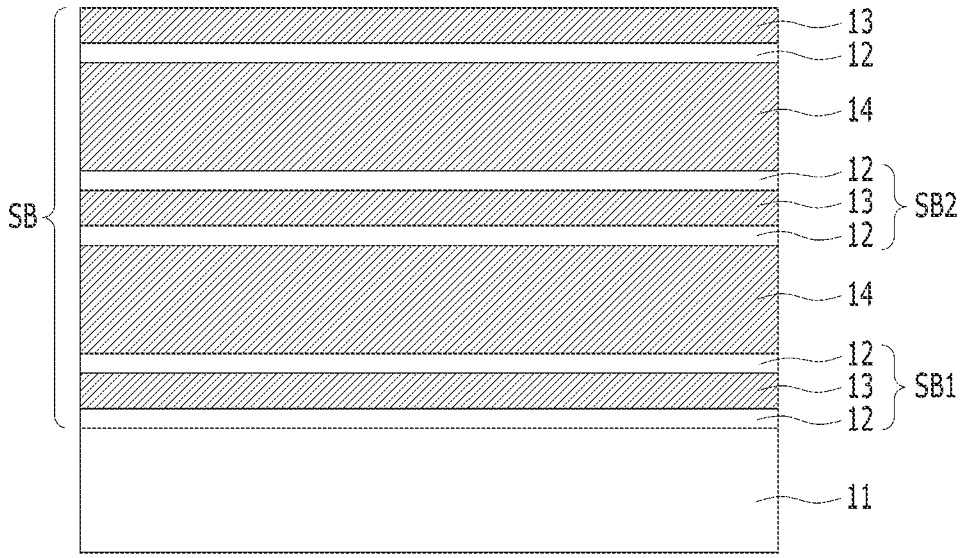
FIGS. 3 to 24 illustrate an example of a method for fabricating a semiconductor device in accordance with an embodiment of the present invention.

Referring to FIG. 3, a stack body SB may be formed over a lower structure 11. The lower structure 11 may include a semiconductor substrate. For example, the lower structure 11 may include a silicon substrate. In the stack body SB, a plurality of sub-stacks may be alternately stacked. Each of the sub-stacks may include a sacrificial layer 12, a sacrificial semiconductor layer 13, a sacrificial layer 12, and a semiconductor layer 14 that are stacked in the mentioned order. The sacrificial layers 12 may include silicon germanium, and the sacrificial semiconductor layers 13 may include monocrystalline silicon. The semiconductor layer 14 may include monocrystalline silicon. The sacrificial layer 12, the sacrificial semiconductor layer 13, the sacrificial layer 12 and the semiconductor layer 14 may be formed by an epitaxial growth process. The sacrificial layer 12 may be thinner than the sacrificial semiconductor layer 13, and the semiconductor layer 14 may be thicker than the sacrificial semiconductor layer 13.

The stack body SB may include a first sacrificial layer structure SB1, a semiconductor layer 14, and a second sacrificial layer structure SB2. The first sacrificial layer structure SB1 may be disposed below the semiconductor layer 14, and the second sacrificial layer structure SB2 may be disposed over the semiconductor layer 14. The stack body SB may further include a stack of the semiconductor layer 14, the sacrificial layer 12, and the sacrificial semiconductor layer 13 over the second sacrificial layer structure SB2. Each of the first and second sacrificial layer structures SB1 and SB2 may be a triple layer stack of the sacrificial layer 12/the sacrificial semiconductor layer 13/the sacrificial layer 12. For example, when the sacrificial layer 12 includes a silicon germanium layer and the sacrificial semiconductor layer 13 includes a monocrystalline silicon layer, the triple layer of each of the first and second sacrificial layer structures SB1 and SB2 may include a first silicon germanium layer/monocrystalline silicon layer/second silicon germanium layer (SiGe/Si/SiGe) stack.

The sacrificial semiconductor layer 13 may include a first monocrystalline silicon layer, and the semiconductor layer 14 may include a second monocrystalline silicon layer. Accordingly, in the stack body SB, the first sacrificial layer structure SB1 may be disposed below the second single crystalline silicon layer, and the second sacrificial layer structure SB2 may be disposed on or over the second monocrystalline silicon layer. Each of the first and second sacrificial layer structures SB1 and SB2 may include a stack of a first silicon germanium layer/first monocrystalline silicon layer/second silicon germanium layer. The second monocrystalline silicon layer may be thicker than the first monocrystalline silicon layer.

As described in the foregoing embodiments, when memory cells are stacked, the first sacrificial layer structure SB1, the semiconductor layer 14, and the second sacrificial layer structure SB2 may be stacked several times.

Figure 4:
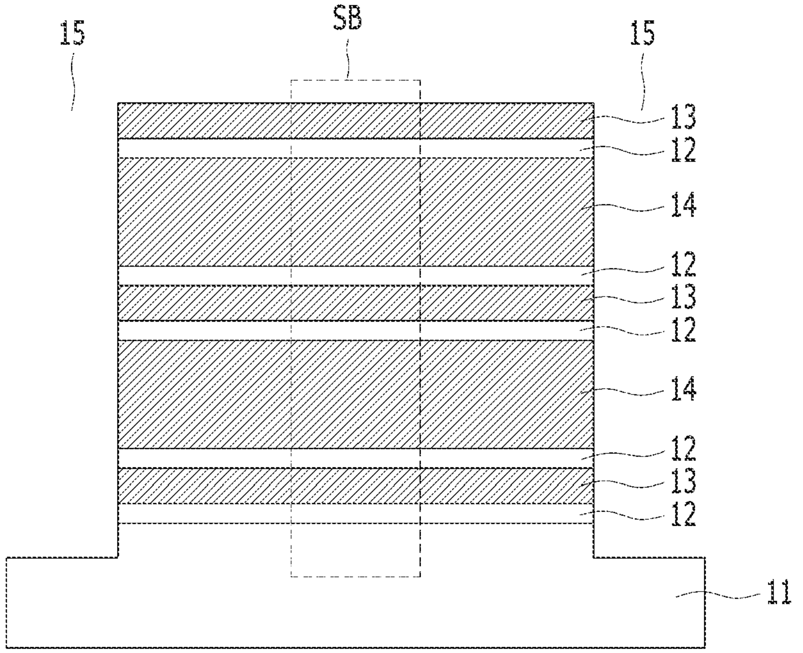

Referring to FIG. 4, first openings 15 may be formed by etching a portion of the stack body SB. The first openings 15 may extend vertically from the surface of the lower structure 11. Before the first openings 15 are formed, the stack body SB may be patterned on the basis of a memory cell.

Figure 5:
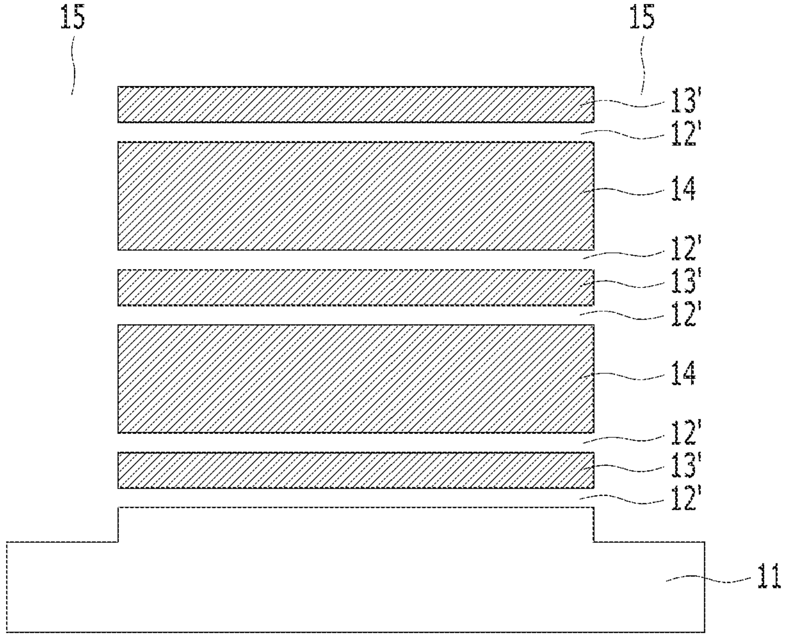

Referring to FIG. 5, a plurality of initial horizontal recesses 12' may be formed between the sacrificial semiconductor layers 13 and the semiconductor layers 14. In order to form a plurality of initial horizontal recesses 12', the sacrificial layers 12 may be selectively removed through the first openings 15. The initial horizontal recesses 12' may have the same size, e.g., the same height.

In order to selectively remove the sacrificial layers 12, a difference in the etch selectivity between the sacrificial semiconductor layers 13 and the semiconductor layers 14 and the sacrificial layers 12 may be used. The sacrificial layers 12 may be removed using a wet etching process or a dry etching process. For example, when the sacrificial layers 12 include a silicon germanium layer and the sacrificial semiconductor layers 13 and the semiconductor layers 14 include a silicon layer, silicon germanium layers may be etched using an etchant or an etchant gas having a selectivity with respect to the silicon layers.

Figure 6:
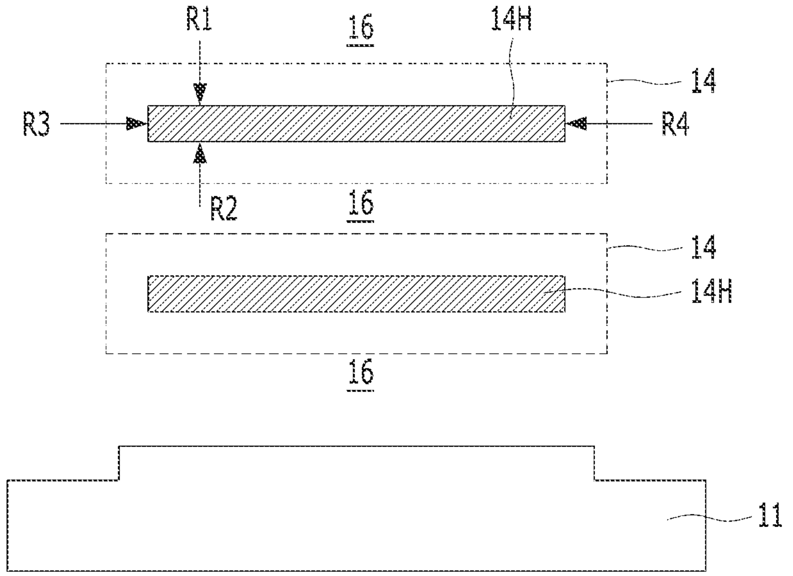

Referring to FIG. 6, the sacrificial semiconductor layers 13 and the semiconductor layers 14 may be recessed (see reference symbols R1, R2, R3 and R4) through the first openings 15 and the initial horizontal recesses 12'. In order to recess the sacrificial semiconductor layers 13 and the semiconductor layers 14, wet etching or dry etching may be used. According to this embodiment of the present invention, the semiconductor layers 14 may be partially etched until all of the sacrificial semiconductor layers 13 are removed. Accordingly, all of the thin sacrificial semiconductor layers 13 may be removed, and the thick semiconductor layers 14 may be thinned as indicated by a reference numeral '14H'. A recess process for forming the thinned semiconductor layer 14H, that is, the semiconductor layer patterns 14H, may be referred to as a thinning process of the semiconductor layers 14. The semiconductor layer patterns 14H may be referred to as thin-body active layers. The semiconductor layer patterns 14H may include a monocrystalline silicon layer. While the semiconductor layer patterns 14H are formed, the surface of the lower structure 11 may be recessed to a predetermined depth.

Through the above-described recess process, the semiconductor layer patterns 14H and the horizontal recesses 16 may be formed. Each of the upper and lower surfaces of the semiconductor layer patterns 14H may include a flat surface.

Figure 7:
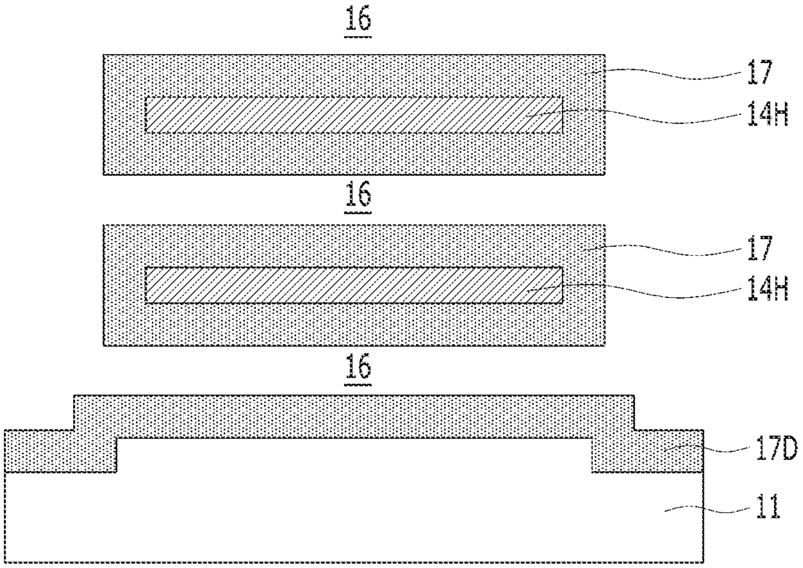

Referring to FIG. 7, a sacrificial dielectric layer 17 fully covering the semiconductor layer patterns 14H may be formed. The sacrificial dielectric layer 17 may be formed by a deposition process. The sacrificial dielectric layer 17 may include silicon oxide, silicon nitride, or a combination thereof. According to this embodiment of the present invention, the sacrificial dielectric layer 17 may be formed of silicon nitride.

While the sacrificial dielectric layer 17 is formed, a dummy sacrificial dielectric layer 17D may be formed on the surface of the lower structure 11. The sacrificial dielectric layer 17 and the dummy sacrificial dielectric layer 17D may be formed of the same material.

Figure 8:
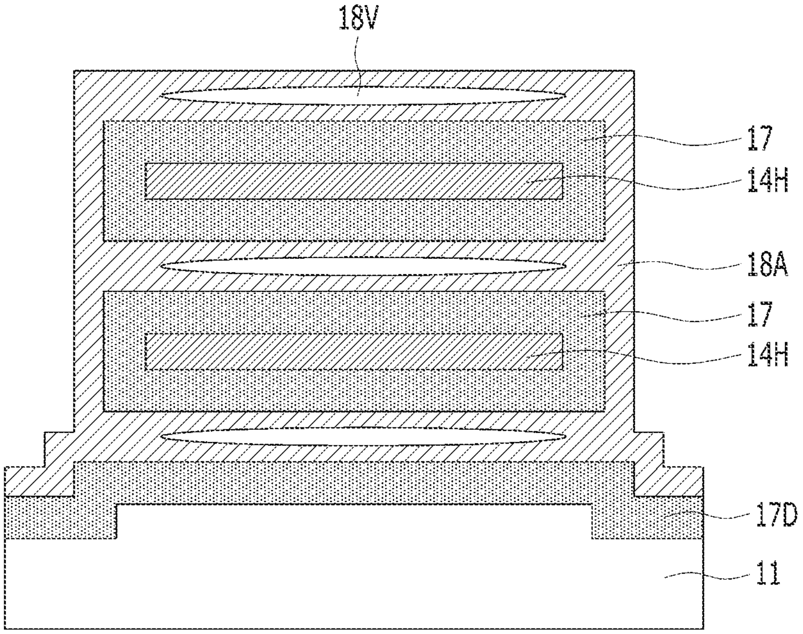

Referring to FIG. 8, a cell isolation layer 18A may be formed over the sacrificial dielectric layer 17. The cell isolation layer 18A may fill the space between the sacrificial dielectric layers 17 that are vertically adjacent to each other. The cell isolation layer 18A may include silicon oxide.

Figure 9:
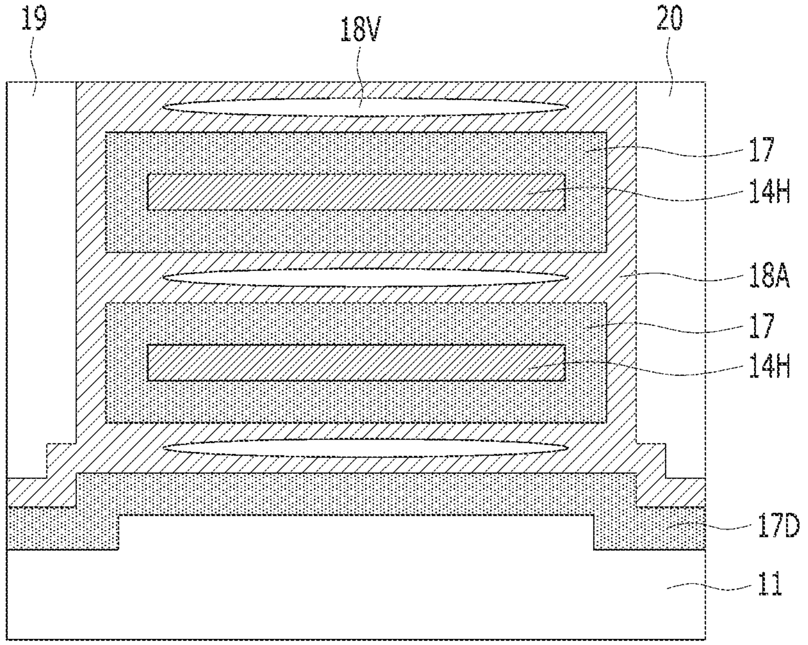

The cell isolation layer 18A may include a void 18V. The void 18V may be disposed within the cell isolation layer 18A. The cell isolation layer 18A may be a silicon oxide layer including void 18V. Referring to FIG. 9, sacrificial separation layers 19 and 20 filling the first openings 15 may be formed. The sacrificial isolation layers 19 and 20 may include a dielectric material, a conductive material, or a combination thereof. The sacrificial isolation layers 19 and 20 may include silicon oxide, silicon nitride, titanium nitride, amorphous carbon, or a combination thereof. The sacrificial isolation layers 19 and 20 may include a first sacrificial isolation layer 19 and a second sacrificial isolation layer 20.

Figure 10:
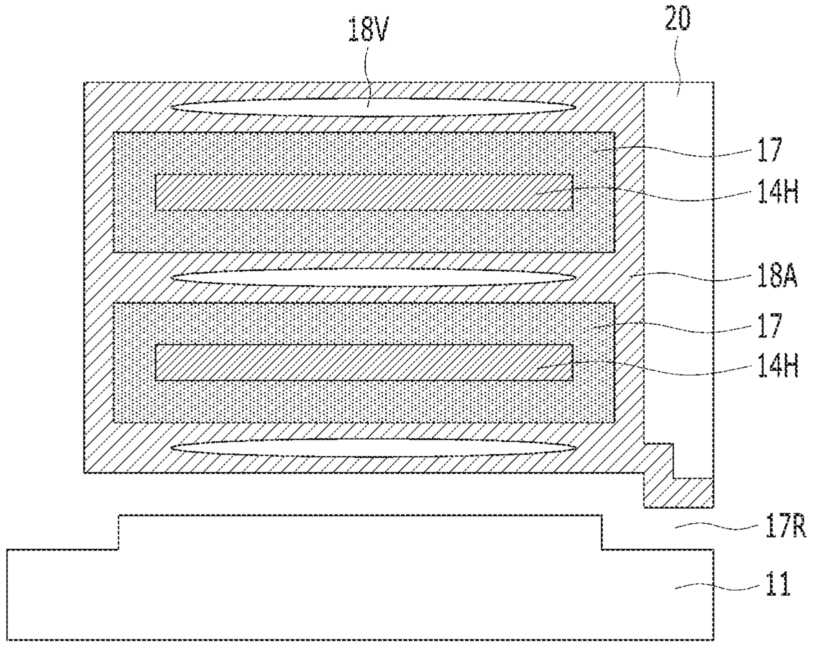

Referring to FIG. 10, one among the sacrificial isolation layers 19 and 20, e.g., the first sacrificial isolation layer 19, may be selectively removed. Subsequently, a lower level gap 17R may be formed by removing the dummy sacrificial dielectric layer 17D. While the dummy sacrificial dielectric layer 17D is removed, the cell isolation layers 18 may act as etch barriers. Accordingly, the voids 18V of the cell isolation layers 18 may not be exposed.

Figure 11:
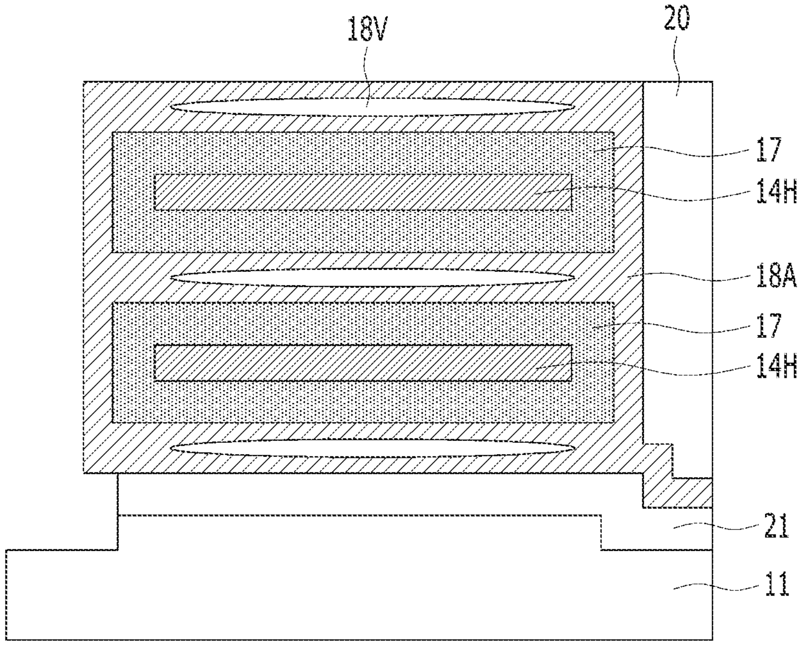

Referring to FIG. 11, a buffer layer 21 filling the lower level gap 17R may be formed. The buffer layer 21 may include silicon oxide. Forming the buffer layer 21 may include depositing silicon oxide filling the lower level gap 17R and etching the silicon oxide.

Figure 12:
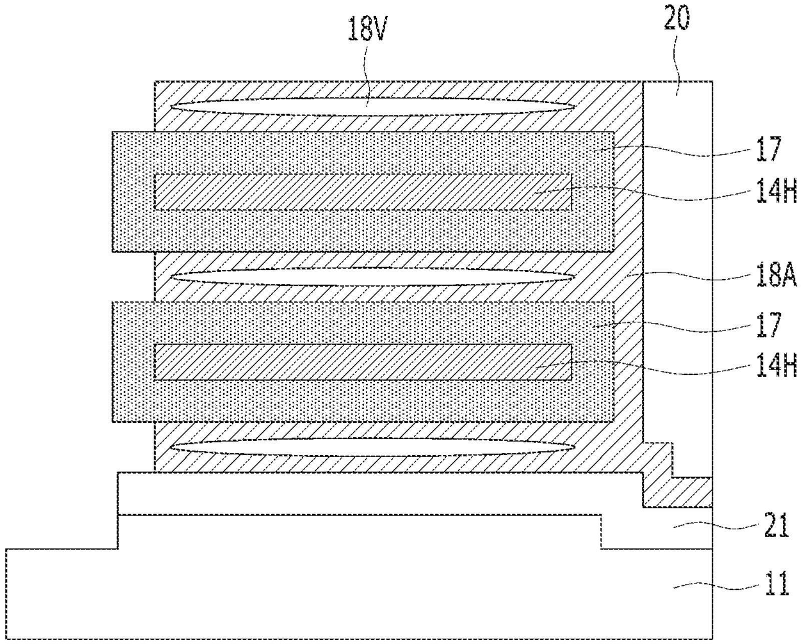

Referring to FIG. 12, a first side of the cell isolation layer 18A may be selectively cut. Accordingly, first edge portions of the sacrificial dielectric layers 17 may be exposed.

Figure 13:
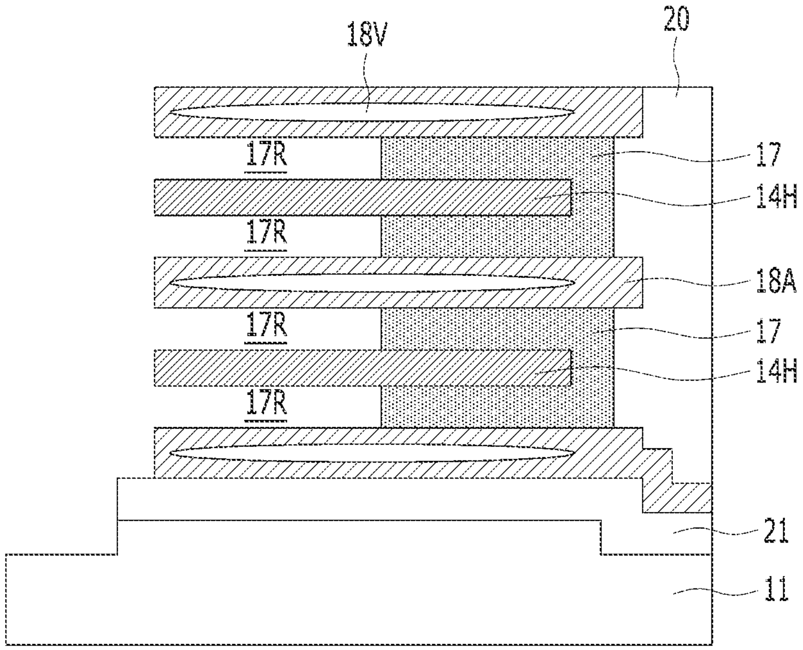

Referring to FIG. 13, the first edge portions of the sacrificial dielectric layers 17 may be selectively recessed. As a result, partial recesses 17R may be formed. Portions of the semiconductor layer patterns 14H may be exposed by the partial recesses 17R. During the formation of the partial recesses 17R, the voids 18V of the cell isolation layers 18A may not be exposed.

Figure 14:
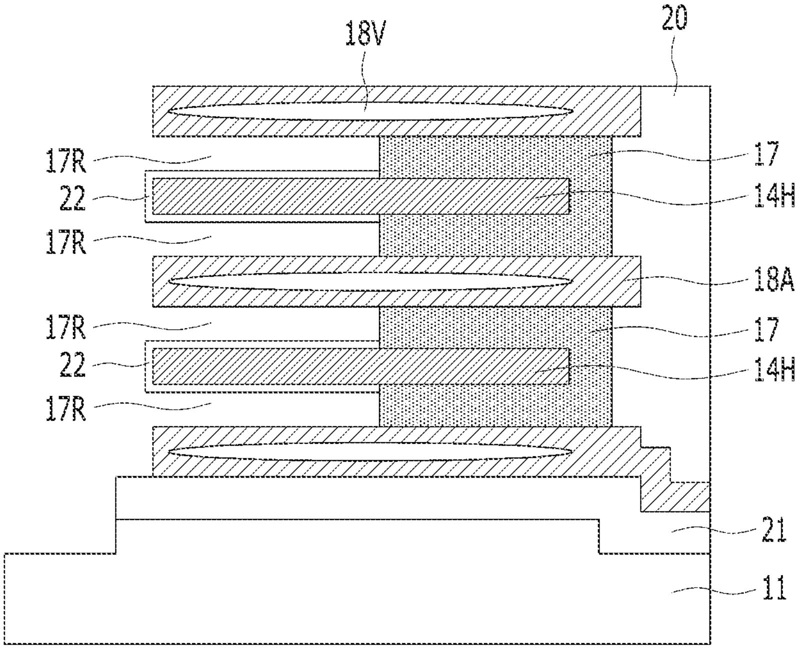

Referring to FIG. 14, a gate dielectric layer 22 may be formed over the exposed portions of the semiconductor layer patterns 14H. The gate dielectric layer 22 may be formed by oxidizing the surface of the semiconductor layer patterns 14H. According to another embodiment of the present invention, the gate dielectric layer 22 may be formed by a deposition process of silicon oxide.

The gate dielectric layer 22 may include silicon oxide, silicon nitride, a metal oxide, a metal oxide nitride, a metal silicate, a high-k material, a ferroelectric material, an anti-ferroelectric material, or a combination thereof. The gate dielectric layer GD may include $SiO_2$, $Si_3N_4$, $HfO_2$, $Al_2O_3$, $ZrO_2$, AlON, HfON, HfSiO, HfSiON, or a combination thereof.

Figure 15:
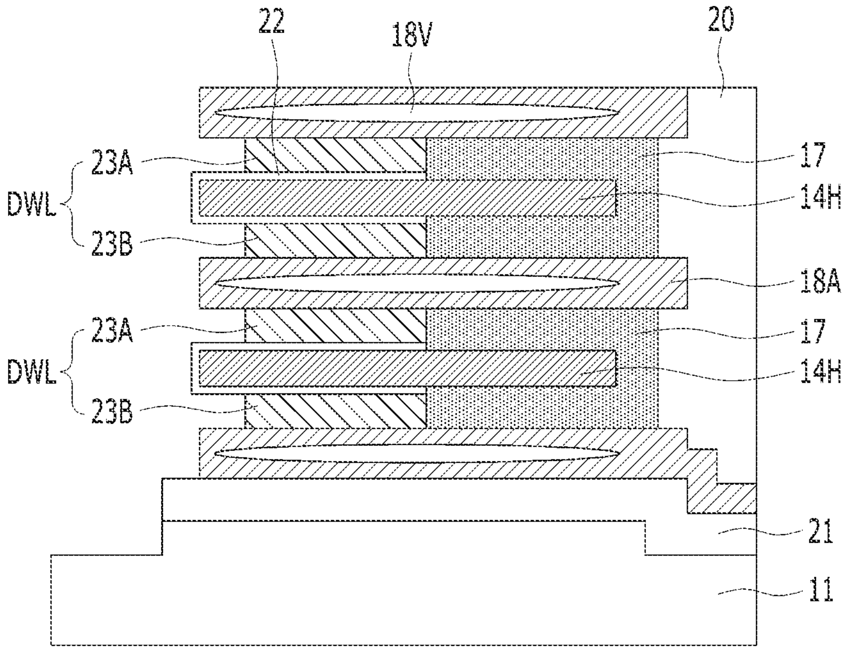

Referring to FIG. 15, a horizontal conductive lines DWL filling the partial recesses 17R may be formed over the gate dielectric layer 22. Forming the horizontal conductive line DWL may include depositing a conductive material filling the partial recesses 17R over the gate dielectric layer 22, and etching back the conductive material. The horizontal conductive line DWL may include a pair of first and second horizontal conductive lines 23A and 23B facing each other with the semiconductor layer pattern 14H interposed therebetween. The first and second horizontal conductive lines 23A and 23B may include a metal-based material, a semiconductor material, or a combination thereof. The first and second horizontal conductive lines 23A and 23B may include titanium nitride, tungsten, polysilicon, or a combination thereof. For example, the first and second horizontal conductive lines 23A and 23B may include a TiN/W stack in which titanium nitride and tungsten are sequentially stacked. The first and second horizontal conductive lines 23A and 23B may include an N-type work function material or a P-type work function material. The N-type work function material may have a low work function of approximately 4.5 eV or less, and the P-type work function material may have a high work function of approximately 4.5 eV or more. The first and second horizontal conductive lines 23A and 23B may include a stack of a metal-based material and a work function material. For example, the first and second horizontal conductive lines 23A and 23B may include a combination of a TiN/W stack and N-type polysilicon.

Figure 16:
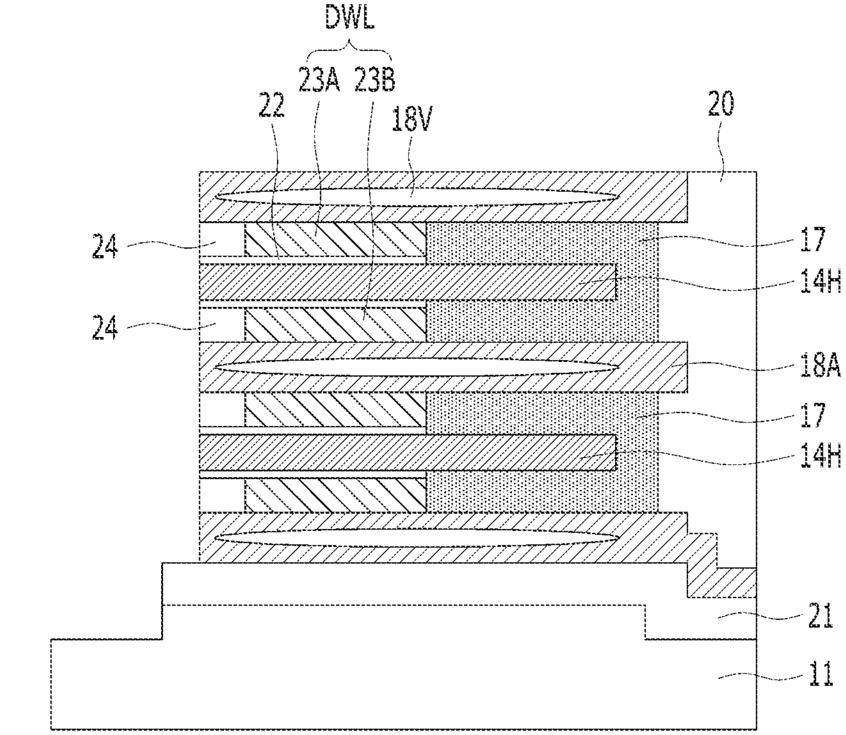

Referring to FIG. 16, a first capping layer 24 may be formed on a first side of the horizontal conductive line DWL. The first capping layer 24 may include silicon oxide, silicon nitride, or a combination thereof. To form the first capping layer 24, a capping material may be deposited and etched back.

While the horizontal conductive line DWL and the first capping layer 24 are formed, the voids 18V of the cell isolation layer 18A may not be exposed.

Figure 17:
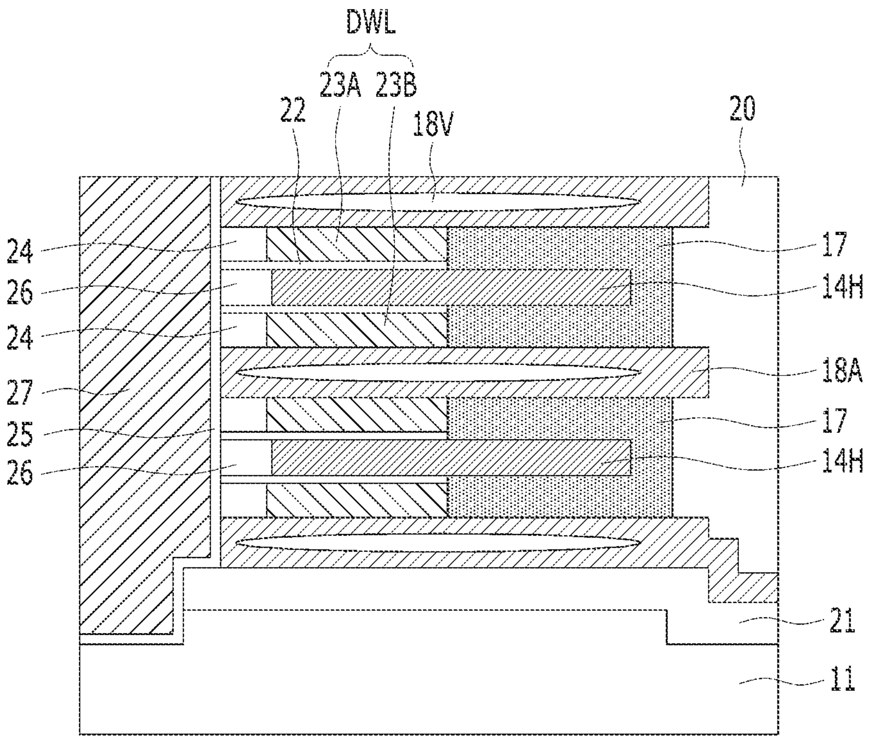

Referring to FIG. 17, a first doped region 26 may be formed on a first side of each of the semiconductor layer patterns 14H. Forming the first doped region 26 may include depositing polysilicon which is doped with an N-type impurity, performing a heat treatment, and removing the doped polysilicon. The first doped region 26 may include impurities diffused from doped polysilicon. According to another embodiment of the present invention, the first doped region 26 may be formed by a process of doping impurities.

Subsequently, a first contact node 25 and a vertical conductive line 27 may be formed. The first contact node 25 and the vertical conductive line 27 may be commonly coupled to the first doped regions 26. The vertical conductive line 27 may include titanium nitride, tungsten, or a combination thereof. The vertical conductive line 27 may include a bit line.

The first contact node 25 may include polysilicon which is doped with an N-type impurity. The first doped region 26 may include an N-type impurity diffused from the first contact node 25. In other words, the first doped region 26 may be formed by the subsequent heat treatment after the first contact node 25 is formed.

According to another embodiment of the present invention, a first ohmic contact may be formed between the vertical conductive line 27 and the first contact node 25. The first ohmic contact may include a metal silicide. For example, a metal silicide may be formed by sequentially performing a metal layer deposition process and an annealing process, and the unreacted metal layer may be removed. A metal silicide may be formed by reacting silicon of the first contact node 25 with the metal layer.

Figure 18:
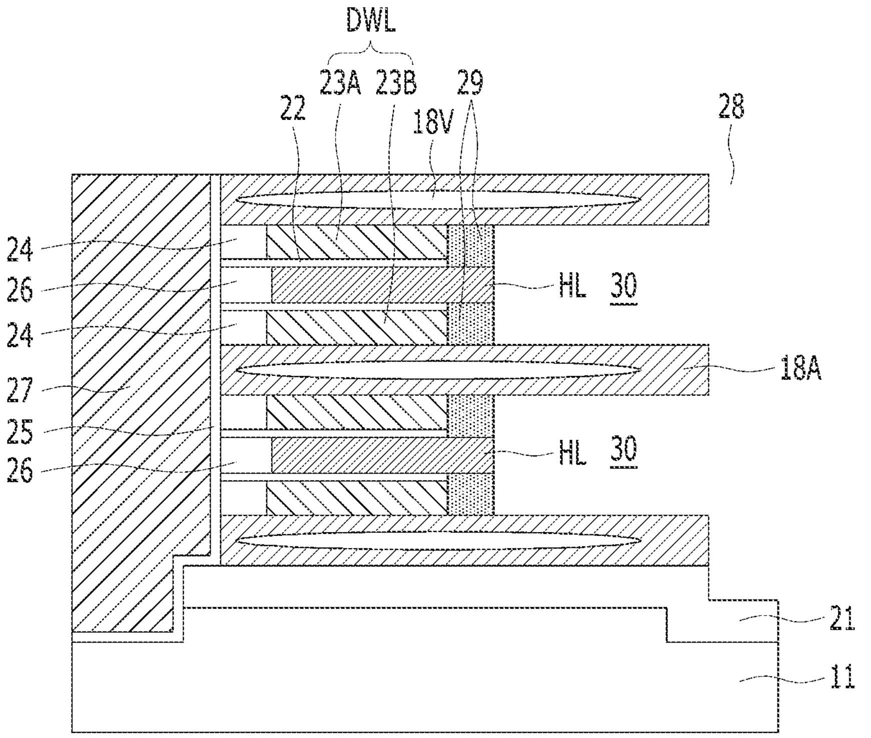

Referring to FIG. 18, the second opening 28 may be formed by removing the second sacrificial separation layer 20. The second opening 28 may extend vertically from the surface of the lower structure 11.

A second edge portion of the sacrificial dielectric layer 17 may be exposed by the second opening 28.

Subsequently, the second edge portion of the sacrificial dielectric layer 17 may be selectively horizontally recessed through the second opening 28. Accordingly, a second capping layer 29 may be formed on a second side of the horizontal conductive line DWL. The first capping layer 24 and the second capping layer 29 may be formed of the same material or different materials.

Subsequently, the semiconductor layer patterns 14H may be selectively cut to be self-aligned to the second capping layer 29. As a result, storage openings 30 may be formed.

The semiconductor layer patterns 14H may remain as the horizontal layer HL, which is indicated by a reference symbol 'HL', and the second-side end of the horizontal layer HL may be exposed by the storage opening 30.

The storage openings 30 may be disposed between the cell isolation layers 18A.

As described above, a structure before the storage openings 30 are formed may be referred to as a cell body. The cell body may include a stack of a first cell isolation layer, a first sacrificial dielectric layer, a horizontal layer HL, a second sacrificial dielectric layer, and a second cell isolation layer. The first cell isolation layer and the first sacrificial dielectric layer may refer to the cell isolation layer 18 and the sacrificial dielectric layer 17 that are disposed below the horizontal layer HL, and the second cell isolation layer and the second sacrificial dielectric layer may refer to the cell isolation layer 18 and the sacrificial dielectric layer 17 that are disposed on or over the horizontal layer HL. After the cell body is formed, storage openings 30 may be formed in the cell body. The cell body may further include a horizontal conductive line DWL, a gate dielectric layer 22, a first contact node 25, and a vertical conductive line 27.

Figure 19:
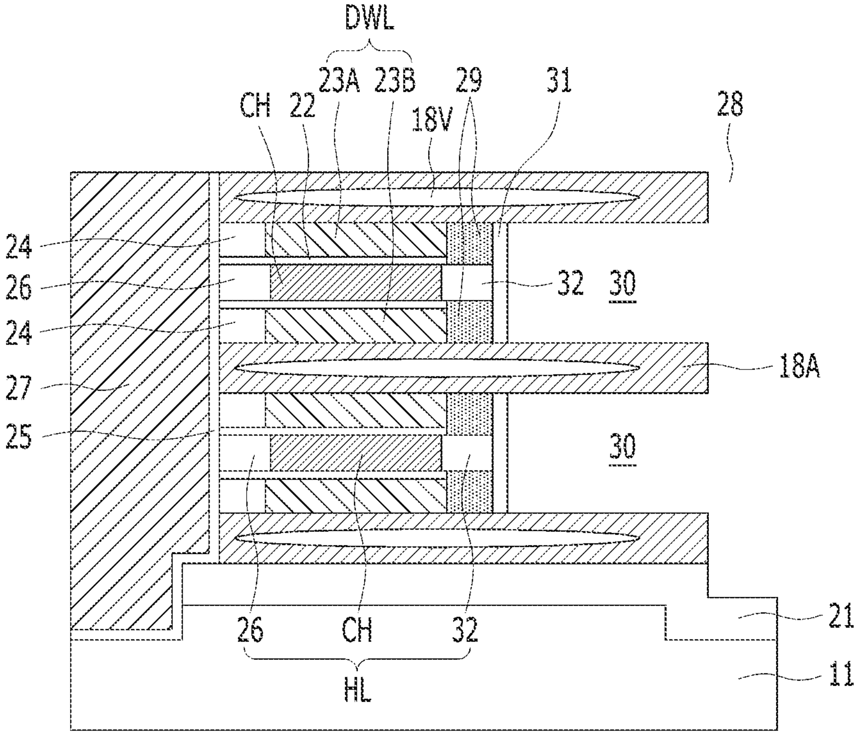

Referring to FIG. 19, a second contact node 31 may be formed on a second side of the horizontal layer HL. The second contact nodes 31 may be respectively coupled to the individual horizontal layers HL. The second contact node 31 may include polysilicon which is doped with an N-type impurity. To form the second contact node 31, a process of depositing polysilicon doped with an N-type impurity and a process of performing an etch-back process may be sequentially performed.

Subsequently, a second doped region 32 may be formed in the horizontal layer HL. Forming the second doped region 32 may include depositing polysilicon doped with an N-type impurity, performing a heat treatment, and removing the doped polysilicon. The second doped region 32 may include impurities diffused from the doped polysilicon. According to another embodiment of the present invention, the doped polysilicon may remain after the heat treatment. According to another embodiment of the present invention, the second doped region 32 may be formed by a process of doping an impurity. The second doped region 32 may include an N-type impurity diffused from the second contact node 31. In other words, the first doped region 32 may be formed by the subsequent heat treatment after the second contact node 31 is formed.

The semiconductor layer patterns 14H may be converted into a horizontal layers HL through a series of the processes described above, and the individual horizontal layers HL may include the first doped region 26 and the second doped region 32. Each horizontal layer HL may further include a channel CH, and the channel CH may be defined between the first doped region 26 and the second doped region 32. The channel CH may overlap with the horizontal conductive line DWL.

Figure 20:
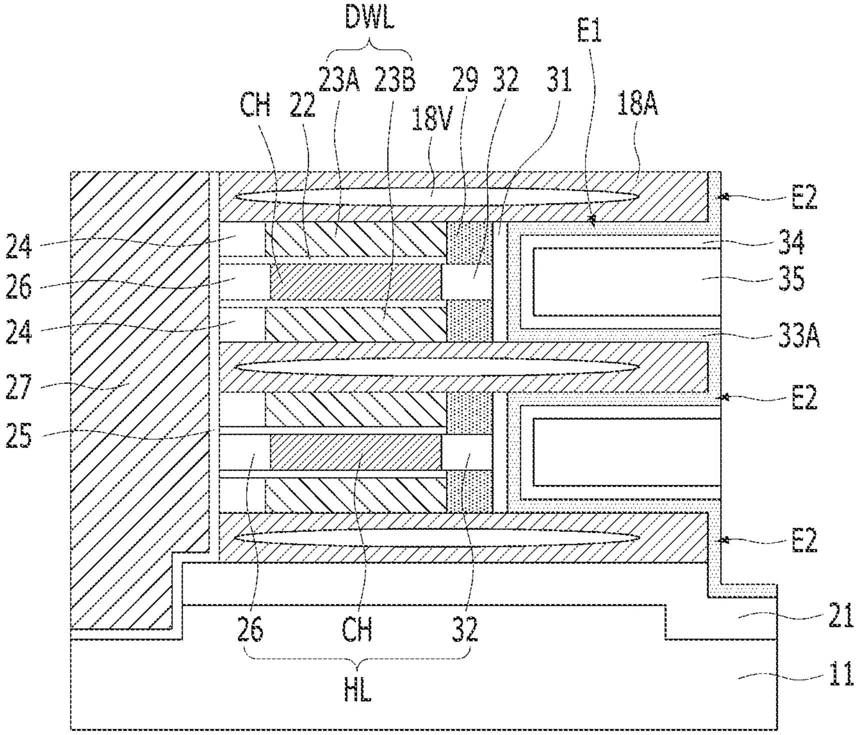

Referring to FIG. 20, a first electrode layer 33A may be conformally formed over the second contact node 31. The first electrode layer 33A may include a conductive material. The first electrode layer 33A may be a metal-based material and may include, for example, a metal, a noble metal, a metal nitride, a conductive metal oxide, a conductive noble metal oxide, a metal carbide, a metal silicide, or a combination thereof. For example, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack or a combination thereof. According to this embodiment of the present invention, the first electrode layer 33A may include titanium, titanium nitride, or a combination thereof.

A first passivation layer 34 and a second passivation layer 35 may be formed over the first electrode layer 33A. The first passivation layer 34 and the second passivation layer 35 may include a material having an etch selectivity with respect to the first electrode 33A. The first passivation layer 34 and the second passivation layer 35 may be formed of different materials. The first passivation layer 34 may be silicon oxide, and the second passivation layer 35 may be polysilicon.

The first passivation layer 34 and the second passivation layer 35 may be materials that act as etch stoppers during the subsequent etching process of the first electrode layer 33A, and form a double passivation layer structure.

Portions of the first electrode layer 33A may be exposed by selectively etching the first passivation layer 34 and the second passivation layer 35. Here, the exposed portions of the first electrode layer 33A may be horizontally disposed portions, which are identical to those of the cell isolation layer 18A.

The first electrode layer 33A may include a plurality of non-cutting portions E1 and a plurality of to-be-cut portions E2. The non-cutting portions E1 may refer to portions to be protected from a subsequent etching process, and the to-be-cut portions E2 may refer to portions to be removed by the subsequent etching process. The non-cutting portions E1 may be fully covered by the first and second passivation layers 34 and 35, and the to-be-cut portions E2 may not be covered by the first and second passivation layers 34 and 35. The non-cutting portions E1 may cover a first-side surface of the second contact node 31.

Figure 21:
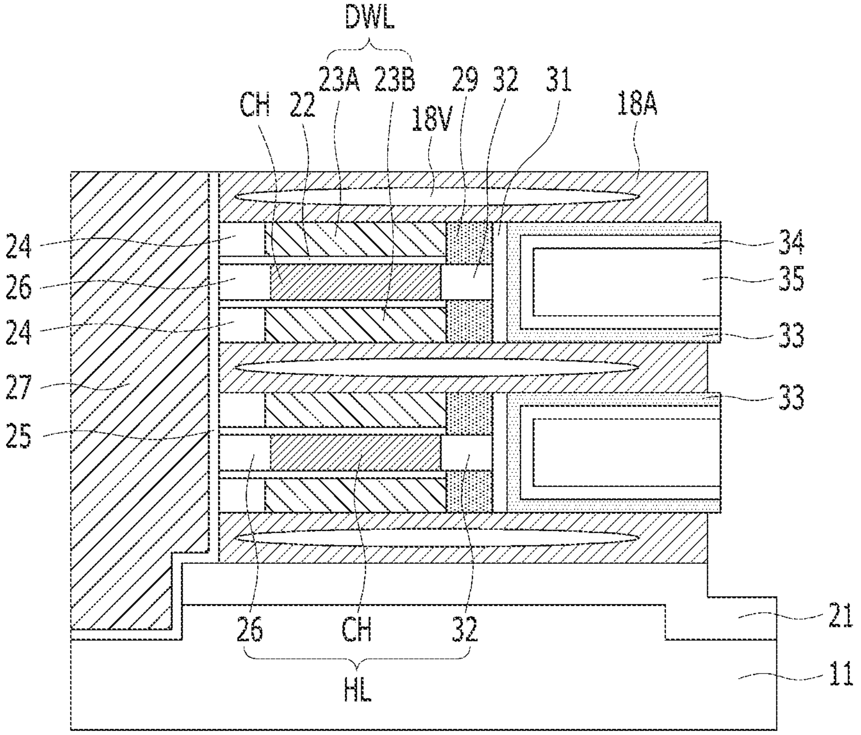

Referring to FIG. 21, the first electrodes 33 of the data storage element may be formed to contact the second-side ends of the horizontal layers HL, respectively. To form the first electrode 33, a process of etching the first electrode layer 33A may be performed. The exposed portions of the first electrode layer 33A may be etched, and thus a first-side surface of the cell isolation layer 18A may be exposed. The first electrode 33 may have a horizontally oriented cylindrical shape.

The inside of the cylinder of the first electrode 33 may be protected by the first passivation layer 34 and the second passivation layer 35.

While the first electrode 33 is formed, the voids 18V of the cell isolation layer 18A may not be exposed.

Figure 22:
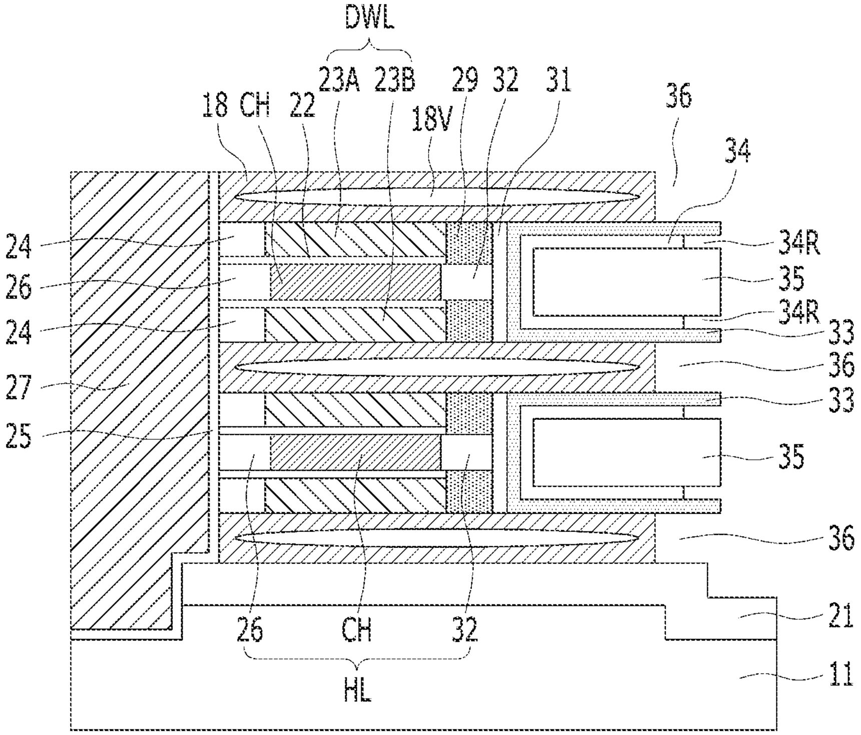

Referring to FIG. 22, the cell isolation layers 18A may be partially recessed (see a reference numeral 36). As a result, the outer walls of the first electrodes 33 may be exposed. The remaining cell isolation layers 18 may contact the horizontal conductive line DWL.

While the cell isolation layers 18A are recessed 36, portions of the first passivation layer 34 may be horizontally recessed (see a reference numeral 34R). The outermost portions of the first electrode 33 may protrude through the recesses 34R of the first passivation layers 34. The voids 18V may not be exposed while the cell isolation layers 18A are recessed 36.

As described above, since the outer walls of the first electrodes 33 are exposed by the partial recess of the cell isolation layers 18A, the exposed surface area of the first electrodes 33 may be increased.

Figure 23:
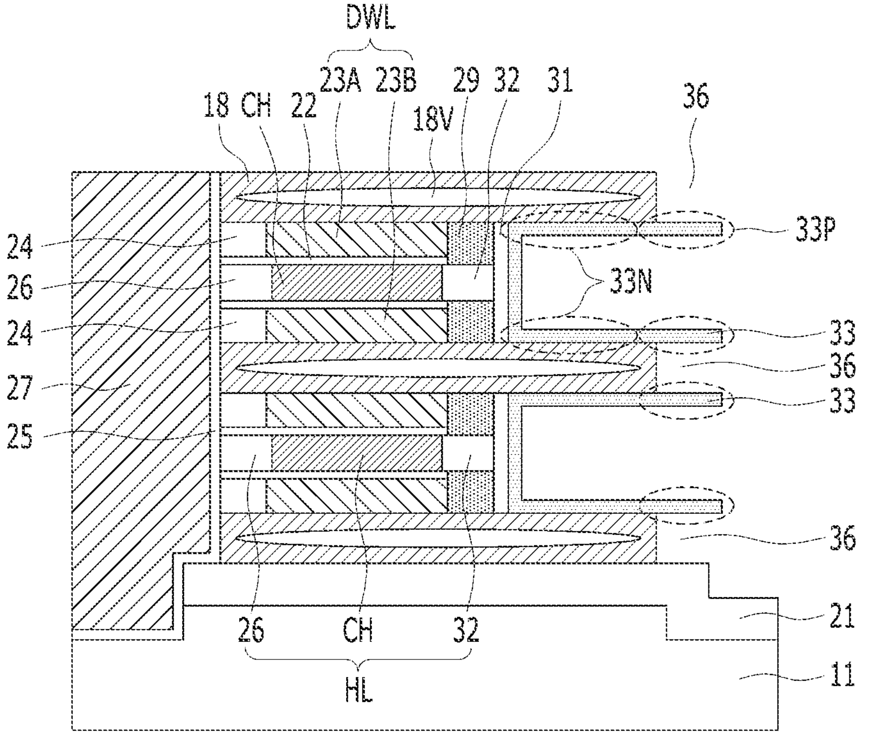

Referring to FIG. 23, after the second passivation layer 35 is removed, the first passivation layer 34 may be removed. Accordingly, portions of the inner and outer walls of the first electrode 33 may be exposed. The exposed portion of the outer wall of the first electrode 33 may be simply referred to as a protruding portion 33P of the first electrode 33.

The first electrode 33 has a horizontally oriented cylindrical structure and may include an inner wall and a plurality of outer walls, and the outer walls of the first electrode 33 may be partially covered by the cell isolation layers 18. The first electrode 33 may include a covered portion 33N that is partially covered by the cell isolation layers 18, and a protruding portion 33P that is not covered by the cell isolation layers 18.

The covered portions 33N of the first electrode 33 and the voids 18V may vertically overlap with each other. The horizontal conductive line DWL and the horizontal layer HL may vertically overlap with the voids 18V.

Since the outer walls of the first electrode 33 are partially covered by the cell isolation layers 18, the first electrode 33 may be simply referred to as a semi-cylinder structure.

When the first passivation layer 34 includes silicon oxide, the process of removing the first passivation layer 34 may include a silicon oxide stripping process. When the second passivation layer 35 includes polysilicon, the process of removing the second passivation layer 35 may include a polysilicon stripping process. Voids 18V of the cell isolation layers 18 may not be exposed while the second passivation layer 35 and the first passivation layer 34 are sequentially removed. For example, during the process of removing the second passivation layer 35, the cell isolation layers 18 may not be etched because they have a selectivity, and during the process of removing the first passivation layer 34, the voids 18V of the cell isolation layers 18 may not be exposed.

Referring to FIGS. 22 and 23, since the outer walls of the first electrodes 33 are partially exposed, the exposed surface area of the first electrodes 33 may be increased by individualizing the process of partially recessing the cell isolation layers 18A and the process of removing the first and second passivation layers 34 and 35. Also, it is possible to prevent the voids 18V of the cell isolation layers 18A from being exposed during the process of removing the first passivation layer 34 and the second passivation layer 35.

Accordingly, the capacitance of the data storage element may be increased by exposing the outer walls of the first electrodes 33.

Figure 24:
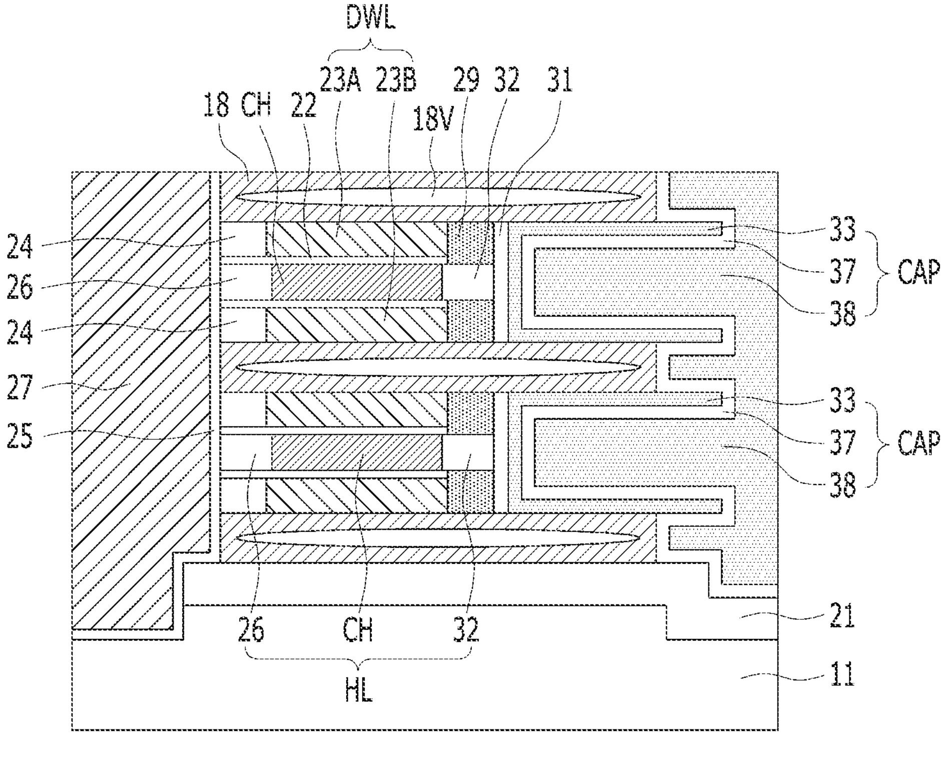

Referring to FIG. 24, a dielectric layer 37 and a second electrode 38 may be sequentially formed over the first electrodes 33. The first electrode 33, the dielectric layer 37, and the second electrode 38 may become a data storage element CAP.

FIGS. 25 to 29 illustrate a method for fabricating a semiconductor device in accordance with another embodiment of the present invention, and FIGS. 25 to 29 illustrate a method for forming a first electrode in accordance with the embodiment of the present invention. In the method for fabricating a semiconductor device in accordance with the embodiment of the present invention, as for the process of forming the first electrode layer 33A, the first passivation layer 34, and the second passivation layer 35, FIGS. 3 to 21 may be referred to.

Figure 25:
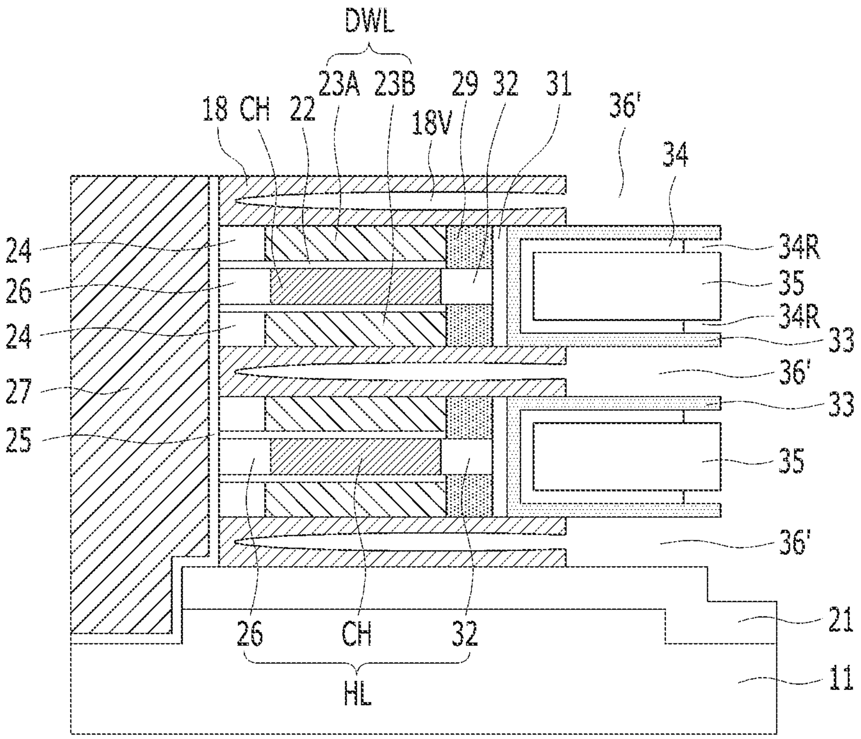
FIGS. 25 to 29 illustrate a method for fabricating a semiconductor device in accordance with another embodiment of the present invention.

Referring to FIG. 25, a first etching process of partially etching the cell isolation layers 18A to expose the voids 18V, for example, the process 36' of recessing the cell isolation layers 18A may be performed. Accordingly, most of the outer walls of the first electrodes 33 may be exposed. The remaining cell isolation layers 18 may contact the horizontal conductive line DWL.

During the recess process 36' of the cell isolation layers 18A, portions of the first passivation layer 34 may be horizontally recessed 34R. The outermost portions of the first electrode 33 may protrude through the recess process 36' of the cell isolation layers 18A and the recess 34R of the first passivation layers 34.

As described above, the voids 18V may be exposed during the recess process 36' of the cell isolation layers 18A. Accordingly, the exposed portion of the outer wall of the first electrode 33 may be increased.

Figure 26:
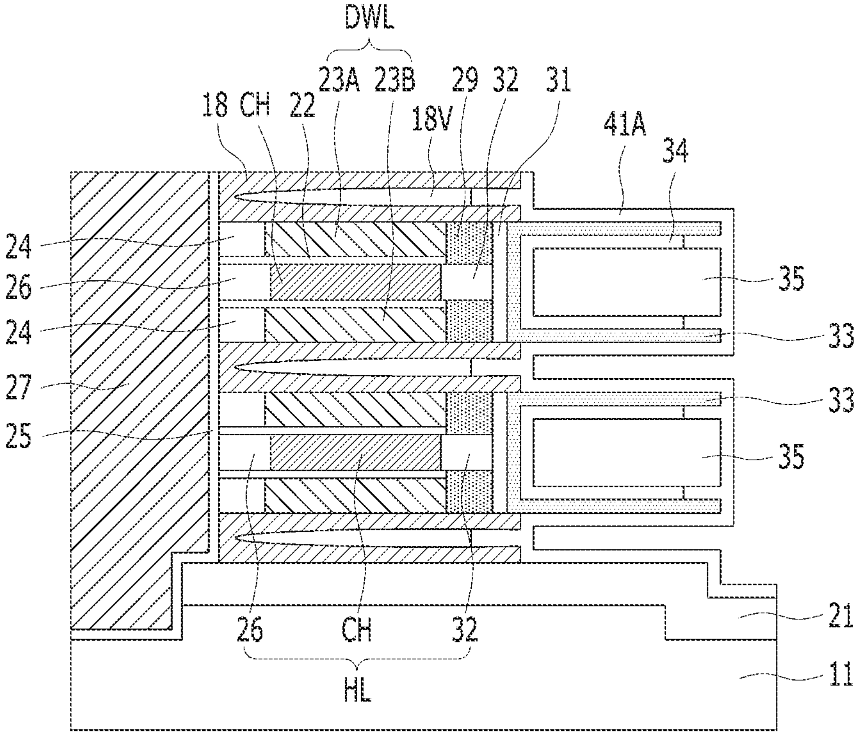
Figure 27:
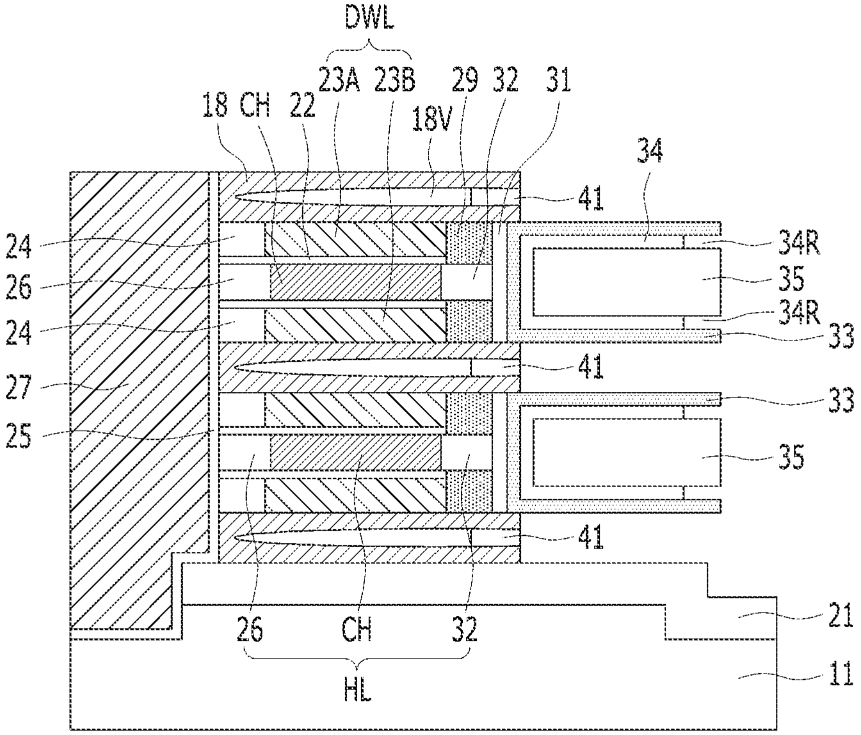

Referring to FIGS. 26 and 27, a void capping layer 41 capping the voids 18V may be formed. The void capping layer 41 may not cover the outer wall of the first electrode 33. The void capping layer 41 may be formed by depositing and etching a void capping material (41A in FIG. 26). An etching process for forming the void capping layer 41 may be referred to as a second etching process. In other words, during the second etching process for forming the void capping layer 41, portions of the cell isolation layers 18 may be recessed.

The void capping material 41A may include silicon oxide. The void capping material 41A may cover the recess 34R of the first passivation layers 34 and the exposed portion of the first electrode 33.

After the void capping layer 41 is formed, the recesses 34R of the first passivation layer 34 may be exposed again.

Referring to FIGS. 25 to 27, the first etching process of the cell isolation layers 18A for exposing the voids 18V, the deposition process of the void capping material 41A, and the second etching process for forming the void capping layer 41 may be sequentially performed.

The first etching process, the deposition process, and the second etching process may be referred to as an Etch-Deposition-Etch (EDE) process. Most of the inner and outer walls of the first electrode 33 may be exposed by the EDE process, and the void capping layer 41 partially capping the voids 18V may be formed.

Figure 28:
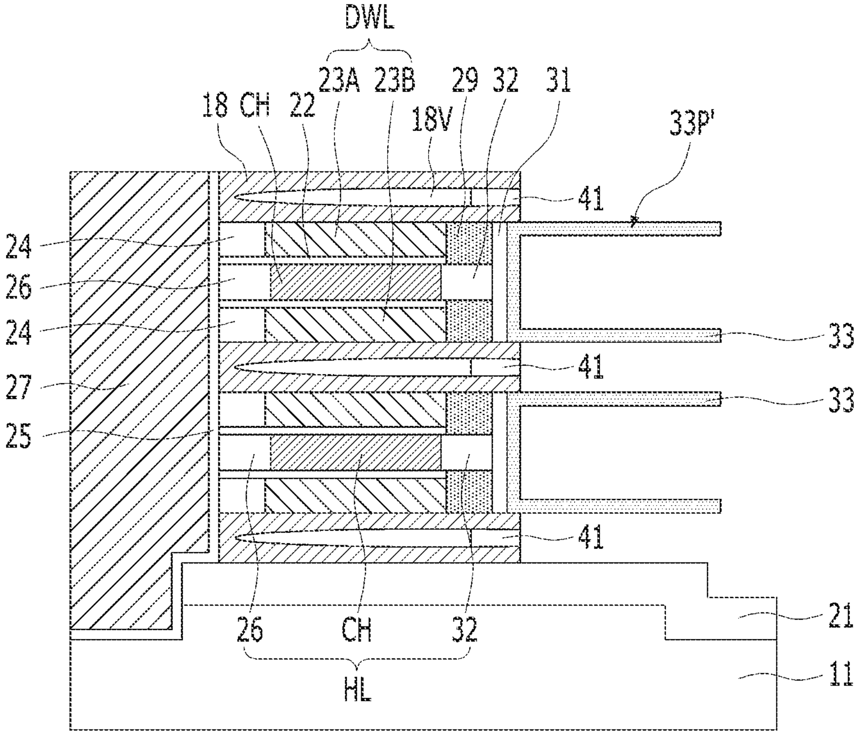

Referring to FIG. 28, the first passivation layer 34 and the second passivation layer 35 may be selectively removed. Accordingly, the inner wall of the first electrode 33 may be exposed, and most of the outer wall of the first electrode 33 may be exposed. The exposed outer wall of the first electrode 33 may be simply referred to as a protruding portion 33P' of the first electrode 33. The protruding portion 33P' of FIG. 28 may have a greater horizontal length than the protruding portion 33P of FIG. 23. The voids 18FV may not overlap with the protruding portions 33P' of the first electrode 33. The protruding portions 33P' of the first electrode 33 may not be covered by the cell isolation layers 18. The voids 18V, the horizontal layer HL, and the first and second horizontal conductive lines 23A and 23B may vertically overlap with each other.

As described above, since the process of partially recessing the cell isolation layers 18 and the process of removing the first and second passivation layers 34 and 35 are individualized, the voids 18V may be prevented from being exposed. Also, since the exposed surface area of the first electrodes 33 is increased, the capacitance of the data storage element may be increased.

Figure 29:
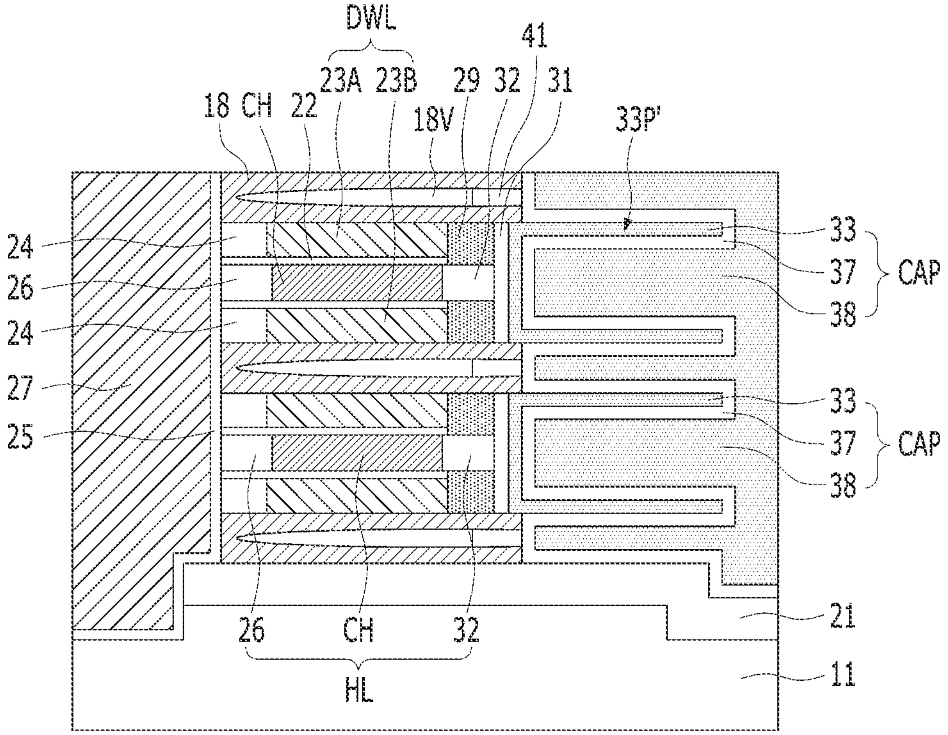

Referring to FIG. 29, a dielectric layer 37 and a second electrode 38 may be sequentially formed over the first electrodes 33. The first electrode 33, the dielectric layer 37, and the second electrode 38 may become a data storage element CAP. The protruding portion 33P' of the first electrode 33 may be fully covered by the dielectric layer 37.

According to the above-described embodiments, when the first electrode 33 of the data storage element is formed in the 3D memory cell, the process of recessing the cell isolation layers 18 and the process of removing the first and second passivation layers 34 and 35 may be individualized. After the first electrode 33 is capped with the first and second passivation layers 34 and 35, the cell isolation layers 18 may be recessed first, and the dielectric layers 18 may be recessed considering the positions of the voids 18V. Since the first and second passivation layers 34 and 35 are removed after the recess process of the cell isolation layers 18, the cell isolation layer 18 may be prevented from being attacked by the voids 18V and the surface area of the first electrode 33 may be increased. Since the surface area of the first electrode 33 is increased, the capacitance of the data storage element may be improved.

Referring to FIGS. 25 to 29, it is possible to protect the cell isolation layers 18 from being attacked through the Etch-Deposition-Etch (EDE) process, and the surface area of the first electrode 33 may be further increased.

According to the embodiment of the present invention, the capacitance of a 3D memory cell may be increased by individualizing a process of recessing cell isolation layers and a process of removing passivation layers.

According to the embodiment of the present invention, since the fabrication process is performed in order of a first etching process, a deposition process, and a second etching process to expose the first electrode, it is possible to increase the capacitance of a 3D memory cell while preventing attack from the voids of the cell isolation layers.

According to the embodiment of the present invention, it is possible to improve electrical characteristics of a 3D memory cell.

While the present invention has been described with respect to specific embodiments, it will be apparent to those skilled in the art that various changes and modifications may be made without departing from the scope of the invention.

What is claimed is:

1. A semiconductor device, comprising:

a lower structure;

a first cell isolation layer and a second cell isolation layer stacked in a direction perpendicular to the lower structure and each including a void;

a horizontal layer disposed between the first cell isolation layer and the second cell isolation layer;

a first horizontal conductive line disposed between the first cell isolation layer and the horizontal layer, and a second horizontal conductive line disposed between the second cell isolation layer and the horizontal layer;

a vertical conductive line coupled to a first side of the horizontal layer; and a data storage element including a first electrode coupled to a second side of the horizontal layer, and disposed between the first cell isolation layer and the second cell isolation layer, wherein the void, the horizontal layer, and the first and second horizontal conductive lines vertically overlap with each other, wherein the first electrode includes an inner wall and a plurality of outer walls, and wherein the outer walls of the first electrode include covered portions that are partially covered by the first and second cell isolation layers, and protruding portions that are not covered by the first and second cell isolation layers, and wherein the covered portions of the first electrode and the voids vertically overlap with each other.

2. The semiconductor device of claim 1, wherein the first electrode includes a horizontally oriented cylindrical structure.

3. The semiconductor device of claim 1, wherein the first and second cell isolation layers include silicon oxide.

4. The semiconductor device of claim 1, further comprising:

a void capping layer capping the voids of the first and second cell isolation layers.

5. The semiconductor device of claim 4, wherein the void capping layer includes silicon oxide.

6. The semiconductor device of claim 1, further comprising:

a first contact node between the vertical conductive line and the horizontal layer; and a second contact node between the first electrode of the data storage element and the horizontal layer.

7. The semiconductor device of claim 6, wherein the first contact node and the second contact node include polysilicon that is doped with an N-type impurity.

8. The semiconductor device of claim 6, wherein the horizontal layer further includes:

a first doped region coupled to the first contact node;

a second doped region coupled to the second contact node; and a channel between the first doped region and the second doped region.

9. The semiconductor device of claim 1,

Wherein the covered portions have a greater horizontal length than the protruding portions.

10. A semiconductor device, comprising:

a lower structure;

a first cell isolation layer and a second cell isolation layer stacked in a direction perpendicular to the lower structure and each including a void;

a horizontal layer disposed between the first cell isolation layer and the second cell isolation layer;

a first horizontal conductive line disposed between the first cell isolation layer and the horizontal layer, and a second horizontal conductive line disposed between the second cell isolation layer and the horizontal layer;

a vertical conductive line coupled to a first side of the horizontal layer;

a data storage element including a first electrode coupled to a second side of the horizontal layer, and disposed between the first cell isolation layer and the second cell isolation layer; and a void capping layer capping the voids of the first and second cell isolation layers, wherein the first electrode includes an inner wall and a plurality of outer walls, wherein the outer walls of the first electrode include covered portions that are partially covered by the first and second cell isolation layers, and protruding portions that are not covered by the first and second cell isolation layers, and wherein the covered portions of the first electrode and the voids vertically overlap with each other.

11. The semiconductor device of claim 10, wherein the void capping layer is disposed within the first and second cell isolation layers to cover an opening of the void.

12. The semiconductor device of claim 10, wherein the void capping layer does not cover the outer wall of the first electrode.

13. The semiconductor device of claim 10, wherein the void capping layer includes silicon oxide.

* * * * *